(12) United States Patent
Kim et al.

(10) Patent No.: US 7,897,975 B2
(45) Date of Patent: Mar. 1, 2011

(54) LIGHT EMITTING DISPLAY DEVICE AND METHOD FOR FABRICATING THE SAME

(75) Inventors: Min Su Kim, Seoul (KR); Doo Seok Yang, Incheon-si (KR); Young Hyo Jung, Gyeongsangbuk-do (KR); Feng Jin Li, Seoul (KR); Kyoung Min Kang, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 113 days.

(21) Appl. No.: 12/318,434

(22) Filed: Dec. 29, 2008

(65) Prior Publication Data

US 2010/0032678 A1   Feb. 11, 2010

(30) Foreign Application Priority Data

Aug. 8, 2008  (KR) ...................... 10-2008-0078131

(51) Int. Cl.
*H01L 33/00* (2010.01)
*H01L 21/027* (2006.01)

(52) U.S. Cl. .................. 257/72; 257/98; 257/E33.053; 257/E21.023; 313/504; 438/23

(58) Field of Classification Search .................. 257/40, 257/72, 98, E23.053, E21.023; 313/112, 313/504; 438/23, 35
See application file for complete search history.

(56) References Cited

U.S. PATENT DOCUMENTS

| 5,667,853 | A | * | 9/1997 | Fukuyoshi et al. | ......... 428/1.62 |
| 7,449,252 | B2 | | 11/2008 | Morii et al. | ................. 428/690 |
| 7,786,669 | B2 | | 8/2010 | Park | .......................... 313/506 |
| 2003/0193624 | A1 | * | 10/2003 | Kobayashi et al. | ............ 349/42 |
| 2007/0096614 | A1 | * | 5/2007 | Shin | .......................... 313/112 |

FOREIGN PATENT DOCUMENTS

| CN | 1738500 A | 2/2006 |
| CN | 1983622 A | 6/2007 |

* cited by examiner

*Primary Examiner*—Victor A Mandala
*Assistant Examiner*—Whitney Moore
(74) *Attorney, Agent, or Firm*—Morgan, Lewis & Bockius LLP (57) ABSTRACT

A light emitting display device includes a first electrode formed at a light emitting region of a first substrate; a transparent oxide thin film of about 1 Å to about 200 Å in thickness formed on an entire surface of the first electrode at the light emitting region to substantially cover particle on the entire surface of the first electrode; an organic light emitting layer formed on an entire surface of the oxide thin film to emit a light; and a second electrode formed on an entire surface of the first substrate including the organic light emitting layer.

7 Claims, 6 Drawing Sheets

LIGHT EMITTING DISPLAY DEVICE AND METHOD FOR FABRICATING THE SAME

This application claims the benefit of Korean Patent Application No. 10-2008-078131, filed on Aug. 8, 2008, which is hereby incorporated by reference as if fully set forth herein.

BACKGROUND OF THE INVENTION

1. Field of the Invention

The present invention relates to a light emitting display device, and more particularly, to a light emitting display device and a method for fabricating the same, in which defects caused by particle formed in fabrication of a light emitting diode display panel are prevented for improving fabrication efficiency and image display efficiency.

2. Discussion of the Related Art

Recently, as image display devices used as monitors for personal computers, personal digital assistants, and various information devices, light weight and thin flat panel display devices are used mostly. In the flat display devices, liquid crystal display devices, light emitting display devices, plasma display devices, field emission display devices and so on are on the rise.

Of the flat display devices, the light emitting display device has a great contrast ratio owing to use of a light emitting display panel which emits a light for itself, enables fabrication of an super thin display device, and is easy to produce a motion picture owing to a response time period of a few microseconds μs.

According to this, active researches on AMOLED (Active Matrix Organic Light Emitting Diode) panel which is the light emitting display panel which emits a light for itself is being made recently. The AMOLED panel is provided with one substrate having a matrix of a plurality of pixels each with sub-pixels of 3 colors R, G, B, and the other substrate which capulates the substrate having the sub-pixels. Each of the sub-pixels has an organic field light emitting cell, and a cell driver for driving the light emitting cell independently. Along with this, active researches for dual panel type AMOLED panel are being made recently, in which the light emitting cells and the cell drivers are formed on different substrates respectively, and the substrates are bonded together to face each other.

However, since the light emitting display panel has at least one conductive metal layer, an inorganic insulating layer, and an organic substance layer deposited thereon in succession and patterned, the light emitting display panel has defects frequently due to lots of particle taken place in the deposition and patterning. In detail, if the conductive metal layer is formed on a substrate, the substrate having the conductive metal layer formed thereon thus is moved to another process line and passed through a process for forming an organic or inorganic layer. Because such processes are performed repetitively until completion of the light emitting display panel, lots of particles present on a surface where the inorganic insulating layer or the organic insulating layer is bonded to the conductive metal layer. Particularly, if the particle present between the organic substance layer and the conductive metal layer, it is liable that adhesive force can become poor due to the particle, or crack of the organic substance layer can take place. Along with this, since the conductive metal layers formed on opposite sides of the organic substance layer can be connected with the particle electrically to form a dark spot, reliability of the product can be impaired.

SUMMARY OF THE INVENTION

Accordingly, the present invention is directed to a light emitting display device and a method for fabricating the same that substantially obviate one or more problems due to limitations and disadvantages of the related art.

An object of the present invention is to provide a light emitting display device in which defects caused by particle formed in fabrication of a light emitting diode display panel are prevented.

Another object of the present invention is to provide a method for fabricating a light emitting display device in which defects caused by particle formed in fabrication of a light emitting diode display panel are prevented.

Another object of the present invention is to improve a fabrication efficiency of a light emitting display device.

Another object of the present invention is to improve an image display efficiency of a light emitting display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting display device includes a first electrode formed at a light emitting region of a first substrate, a transparent oxide thin film of 1 Å~200 Å thickness formed on an entire surface of the first electrode at the light emitting region to cover particle present on the entire surface of the first electrode fully, an organic light emitting layer formed on an entire surface of the oxide thin film to emit a light, and a second electrode formed on an entire surface of the first substrate including the organic light emitting layer.

The oxide thin film is formed of at least one of conductive metals selected from aluminum Al, an aluminum alloy AlNd, copper Cu, silver Ag, titanium Ti, chromium Cr patterned and naturally oxidized.

The device further includes at least one switching device having a gate electrode, source/drain electrodes, a semiconductor layer, an ohmic contact layer, a gate insulating film, and a protective film, and the first or second electrode is electrically connected to a drain electrode of the switching device.

The device further includes a supplementary electrode formed at a non-light emitting region of the first substrate, a buffer layer formed of an inorganic insulating material at the non-light emitting region of the first substrate including the supplementary electrode, a contact spacer formed on the non-light emitting region of the first substrate over the contact electrode on a second substrate, a separator formed under the supplementary electrode for dividing the light emitting regions into sub-pixel units, wherein the first electrode is connected to the supplementary electrode electrically, the organic light emitting layer and the second electrode are separated into the sub-pixel units by the separator, and the second electrode is electrically connected to a drain electrode of the switching device on the second substrate with the contact spacer.

In another aspect of the present invention, a method for fabricating a light emitting display device includes the steps of forming a first electrode at a light emitting region of a first substrate, forming a transparent oxide thin film of 1 Å~200 Å thickness on an entire surface of the first electrode at the light emitting region to cover particle present on the entire surface of the first electrode fully, forming an organic light emitting layer on an entire surface of the oxide thin film to emit a light, and forming a second electrode on an entire surface of the first substrate including the organic light emitting layer.

The oxide thin film is formed of at least one of conductive metals selected from aluminum Al, an aluminum alloy AlNd, copper Cu, silver Ag, titanium Ti, chromium Cr by patterning and naturally oxidizing.

The method further includes the step of forming at least one switching device including a gate electrode, source/drain electrodes, a semiconductor layer, an ohmic contact layer, a gate insulating film, and a protective film, and the first or second electrode is electrically connected to a drain electrode of the switching device.

The method further includes the steps of forming a supplementary electrode at a non-light emitting region of the first substrate, forming a buffer layer of an inorganic insulating material at the non-light emitting region of the first substrate including the supplementary electrode, forming a contact spacer on the non-light emitting region of the first substrate opposite to the contact electrode on a second substrate, forming a separator opposite to the supplementary electrode for dividing the light emitting regions into sub-pixel units, wherein the first electrode is connected to the supplementary electrode electrically, the organic light emitting layer and the second electrode are separated into the sub-pixel units by the separator, and the second electrode is electrically connected to a drain electrode of the switching device on the second substrate with the contact spacer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Figure 1:
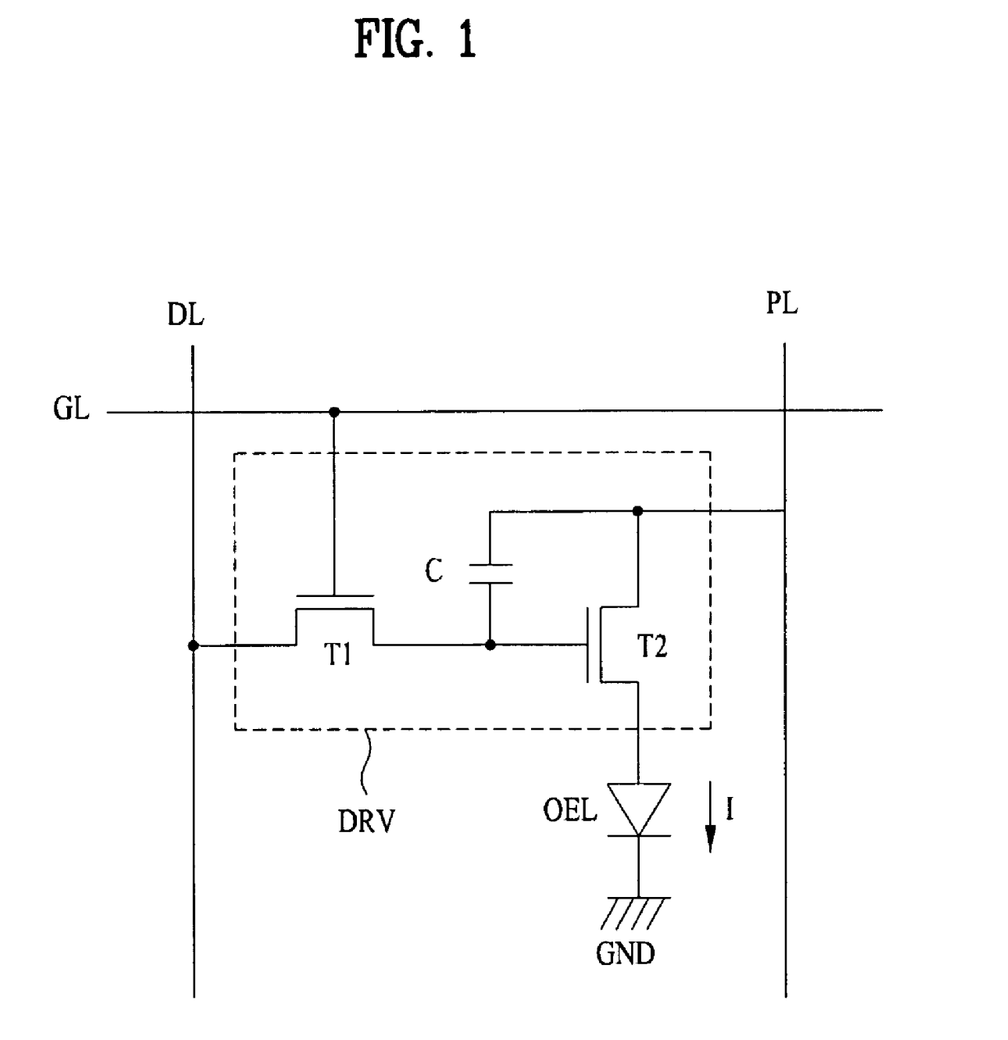
FIG. 1 illustrates an equivalent circuit of a sub-pixel in a light emitting display device in accordance with an embodiment of the invention.

FIG. 1 illustrates an equivalent circuit of a sub-pixel in a light emitting display device in accordance with an embodiment of the invention. Referring to FIG. 1, a sub-pixel includes a cell driver DRV connected to a gate line GL, a data line DL, and a power line PL, and a light emitting cell OEL connected to the cell driver DRV and a second power signal GND so as to be expressed equivalent to a diode.

The cell driver DRV includes a first switching device T1 connected to the gate line GL and a data line DL, a second switching device T2 connected to the first switching device T1, the power line PL, and the light emitting cell OEL, and a storage capacitor C connected to the power line PL, and the first switching device T1.

The first switching device T1 includes a gate electrode connected to the gate line GL, a source electrode connected to the data line DL, and a drain electrode connected to the gate electrode of the second switching device T2. The first switching device T1 is turned on upon reception of a gate on signal at the gate line GL to supply a data signal received at the data line DL to the storage capacitor C and the gate electrode of the second switching device T2.

The second switching device T2 includes a source electrode connected to the power line PL, and a drain electrode connected to the light emitting cell OEL. The second switching device T2 controls a current I supplied from the power line PL to the light emitting cell OEL in response to the data signal from the first switching device for controlling a light emitting quantity from the light emitting cell OEL.

The storage capacitor C is connected to the power line PL and the gate electrode of the second switching device T2. The second switching device T2 maintains a turn on state owing to a voltage charged at the storage capacitor C even if the first switching device T1 is turned off, to maintain light emission from the light emitting cell OEL until the data signal of the next frame is received. In this instance, though the first and second switching devices T1 and T2 may be PMOS or NMOS transistors, only a case the NMOS transistors are used will be described.

Figure 2:
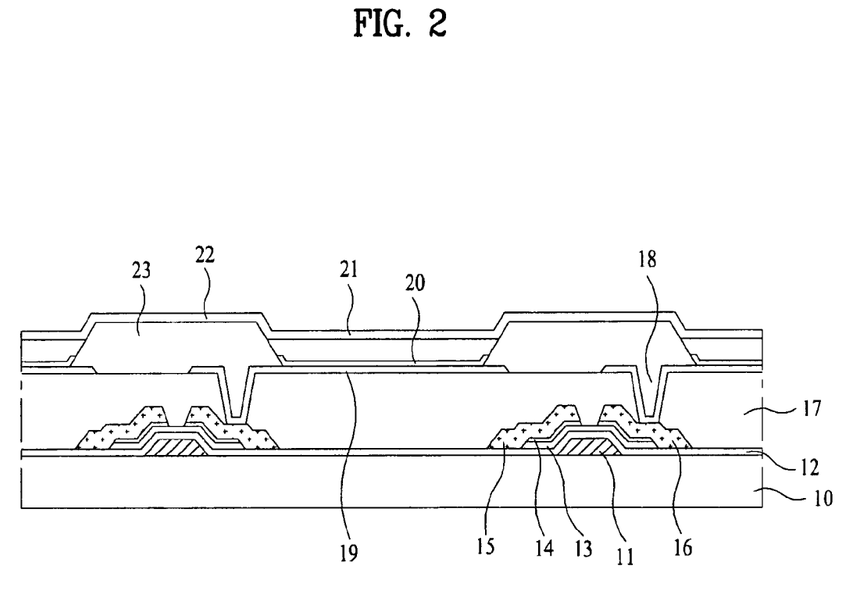
FIG. 2 illustrates a cross-section of a sub-pixel in a light emitting display device in accordance with an embodiment of the invention.

FIG. 2 illustrates a cross-section of a sub-pixel in a light emitting display device in accordance with an embodiment of the invention. Referring to FIG. 2, the light emitting display device includes a light emitting display panel having the cell driver DRV and the light emitting cell OEL formed together on a first substrate, for an example, the lower substrate. An upper substrate (not shown) is formed on the lower substrate 10 for encapsulating the cell driver DRV and the light emitting cell OEL.

The lower substrate 10 has a plurality of light emitting regions for displaying an image, and a plurality of non-light emitting regions for displaying no image. The non-light emitting region has the cell driver DRV for providing various signals required for driving the light emitting cell OEL at the light emitting region. The lower substrate 10 is bonded to the upper substrate (not shown) with sealant applied to peripheries of the upper substrate and the lower substrate 10.

The non-light emitting regions form a shape of grating which exposes the light emitting regions. In detail, the light emitting region is a pixel region for emitting the light from the light emitting cell OEL, and the non-light emitting region is a region having the switching devices T1 and T2 formed thereon for driving the light emitting cells OEL. In the meantime, in an upper side light emitting structure in which the light from the light emitting cell OEL emits through the upper substrate, the switching devices may be formed at the light emitting regions of the lower substrate 10.

Referring to FIG. 2, the switching device on the lower substrate 10 may have a bottom gate structure of amorphous silicon a-Si, and, though not shown, the switching device may also have a top gate structure of a polysilicon.

In an embodiment of the invention, the lower substrate 10 includes a gate electrode 11 formed at a non-light emitting region of the lower substrate 10, a gate insulating film 12 formed on an entire surface of the lower substrate 10 including the gate electrode 11, a semiconductor layer 13 formed on the gate insulating film 12 overlapped with the gate electrode 11, ohmic contact layers 14 formed overlapped with opposite edges of the semiconductor layer 13 respectively, source/drain electrodes 15, and 16 formed on the ohmic contact layers 14, and a protective film 17 formed on an entire surface of the lower substrate 10 including the source/drain electrodes 15 and 16. The gate electrode 11, the source/drain electrodes 15 and 16, the semiconductor layer 13, the ohmic contact layers 14, the gate insulating film 12, and the protective film 17 form the switching device.

The protective film 17 has a contact hole 18 passed through the protective film 17 at each sub-pixel region to expose the drain electrode 16, and each of the contact hole 18 has a first electrode 19 formed thereon in contact with the drain electrode electrically. Along with this, the lower substrate 10 includes a pixel defining layer 23 formed at the non-light emitting region of the lower substrate including the contact hole 18, an oxide thin film 20 formed on a surface of the first electrode 19 at the light emitting region for preventing defects from causing by particle, an organic light emitting layer 21 formed on the oxide thin film 20 at the light emitting region, and a second electrode 22 formed on an entire surface of the lower substrate 10 including the organic light emitting layer 21, additionally. The first electrode 19, the oxide thin film 20, the organic light emitting layer 21, the second electrode 22 form the light emitting cell OEL.

In the meantime, though not shown, the power line PL is formed on the gate insulating film at the non-display region on an outer portion of the lower substrate 10. The power line PL transmits a first power signal, and a second power signal. The first power signal, and the second power signal are power applied to the first and second electrodes 19 and 22 of the light emitting cells OEL. The power line PL is formed of a material the same with a material of the source/drain electrode 15 and 16. That is, the power line PL and the source/drain electrodes 15 and 16 may be formed by the same mask process and at a time. The power line PL is electrically connected to the first or second electrodes 19 or 22 of the light emitting cells OEL through a pad electrode (not shown). Therefore, besides the contact hole 18 connected to the drain electrode 16, the protective film 17 may have contact holes formed therein connected to the power line PL, additionally.

The first electrode 19 is formed on an entire surface of the light emitting regions including the contact hole 18 in each of the sub-pixel regions. The first electrode 19 may serve as an anode or cathode, and is formed of at least one of transparent conductive materials selected from ITO (Indium Tin Oxide), IZO (Indium Zinc Oxide), AZO (Al-doped Zinc Oxide) if it is intended to have a lower side light emission. The ITO is a transparent conductive film with a comparatively uniform work function to have a low hole injection barrier against the organic light emitting layer 21. Opposite to this, the first electrode 19 may be formed of at least one of metals selected from ITO/Ag, ITO/Ag/ITO, ITO/Ag/IZO (Indium Zinc Oxide), aluminum Al, aluminum alloy AlNd, copper Cu, silver Ag, and copper alloy, if it is intended to have an upper side light emission.

The pixel defining layer 23 is a barrier surrounding each of the sub-pixels at the non-light emitting region for improving an aperture of the light emitting region, and may be formed opposite to a position of the switching device. The pixel defining layer 23 defines boundaries between the light emitting cells OEL at the light emitting regions clearly for making light emitting boundary regions between the light emitting regions clearer. The pixel defining layer 23 includes a sloped surface formed at the first electrode 19. The sloped surface may have an angle from the first electrode 19, i.e., an angle of taper, of 10~20 degrees. The pixel defining layer 23 may be formed of an insulating material of oxide silicon SiOx, nitride silicon SiNx, photoacryl, benzocyclobutene BCB coated and patterned.

The oxide thin film 20 is formed to face the first electrode 19 on a surface of the first electrode 19 to cover all the particle present on the first electrode 19. As described before, since the first electrode 19 is formed of conductive material such as ITO, IZO, AZO, the first electrode 19 is formed through a process line in which a metal is deposited and patterned. However, since the pixel defining layer 23 or the organic light emitting layer 21 which is formed thereafter, is formed of an organic or inorganic material, the lower substrate 10 having the first electrode 19 formed thereon moves to the process line for handling the organic or inorganic material. Because the pixel defining layer 23 is formed as an inorganic insulating material is deposited and patterned, the first electrode 19 becomes to have the lots of particle stuck thereto in a process moving through the process line and has much more particle stuck thereto in a process of deposition and patterning the inorganic insulating material. In order to prevent defects from causing by the particle, the oxide thin film 20 is formed on the surface of the first electrode 19. The oxide thin film 20 serves to make an electric contact area with the organic light emitting layer 21 to be formed later greater and enhance an adhesive force to the organic light emitting layer 21. The oxide thin film 20 may be formed of at least one of conductive metals selected from aluminum Al, aluminum alloy AlNd, copper Cu, silver Ag, titanium Ti, chromium Cr patterned and naturally oxidized. In this instance, for making maximum prevention of a light transmissivity from being impaired, the oxide thin film 20 is formed to have a thickness of 1 Å~200 Å.

Though not shown in detail in the drawing, the organic light emitting layer 21 includes a hole injection layer HIL, a hole transporting layer HTL, a light emitting layer OEL, an electron injection layer EIL, and an electron transporting layer ETL. The hole injection layer HIL is formed on the oxide thin film 20 on the surface of the first electrode 19, and the hole transporting layer HTL is formed on an entire surface of an upper side of the hole injection layer HIL. The light emitting layer OEL is formed on the hole transporting layer HTL at the light emitting region, and the electron injection layer EIL is formed on an entire surface of an upper side of the light emitting layer OEL. The electron transporting layer ETL is formed on an upper side surface of the electron injection layer EIL.

The light emitting layer OEL includes a red light emitting layer for displaying a pixel of red color, a green light emitting layer for displaying a pixel of green color, and a blue light emitting layer for displaying a pixel of blue color. The light emitting layer OEL at each of the light emitting regions is one of the red light emitting layer, the green light emitting layer, and the blue light emitting layer.

That is, the red light emitting layer, the green light emitting layer, and the blue light emitting layer form one unit pixel. In the meantime, the unit pixel may further include a white light emitting layer, when the unit pixel includes the red light emitting layer, the green light emitting layer, the blue light emitting layer, and the white light emitting layer.

The light emitting layer OEL is selectively patterned so as to be formed at the light emitting region. As a method for patterning the light emitting layer, a method of using a shadow mask may be used if the light emitting layer is formed of a small molecular organic material, and inkjet printing or laser inducing thermal imaging may be used if the light emitting layer is formed of a macromolecular organic material. The laser inducing thermal imaging enables micro-patterning of the light emitting layer, is applicable to a large area, and favorable for high resolution, and a dry type opposite to a wet type of the inkjet printing.

The second electrode 22 is formed to cover an entire surface of the lower substrate 10 including the pixel defining layer 23 and the organic light emitting layer 21. The second electrode 22 may serve as a cathode or an anode, and may be formed of at least one of materials selected from aluminum Al, an aluminum alloy AlNd, copper Cu, a copper alloy, ITO, ITO/Ag/ITO, ITO/Ag/IZO (Indium Zinc Oxide), which have a low work function value, or a material equivalent thereto if it is intended to have a lower side light emission. Opposite to this, the first electrode 19 may be formed of at least one of transparent conductive materials selected from ITO, IZO, and AZO, if it is intended to have an upper side light emission.

Figure 3A:
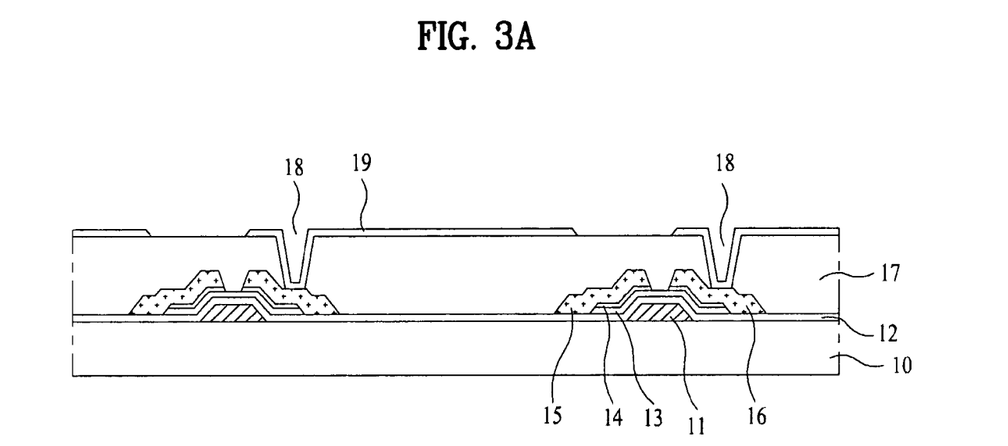
FIGS. 3A and 3B illustrate fabrication steps in a method for fabricating a lower substrate of the light emitting display device shown in FIG. 2, respectively.
Figure 3B:
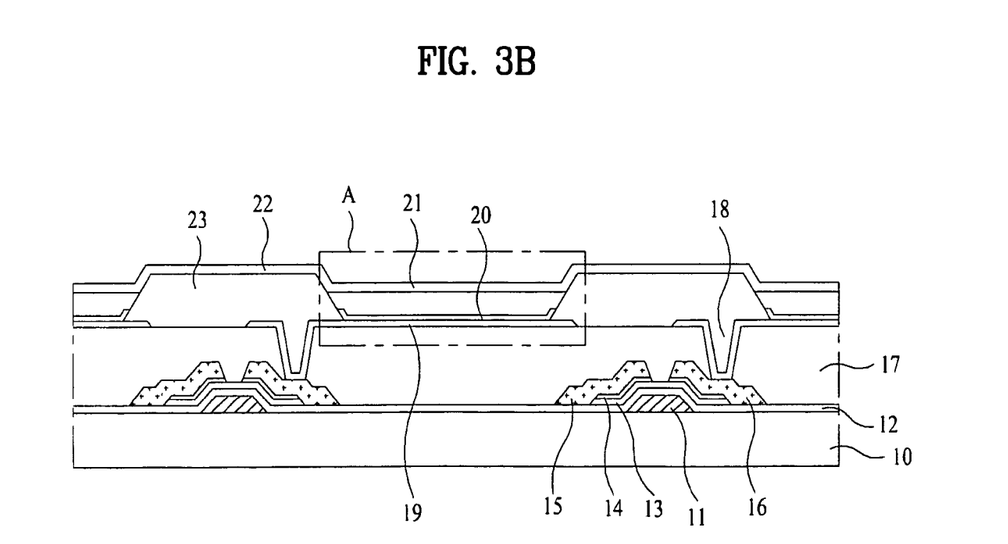
Figure 4:
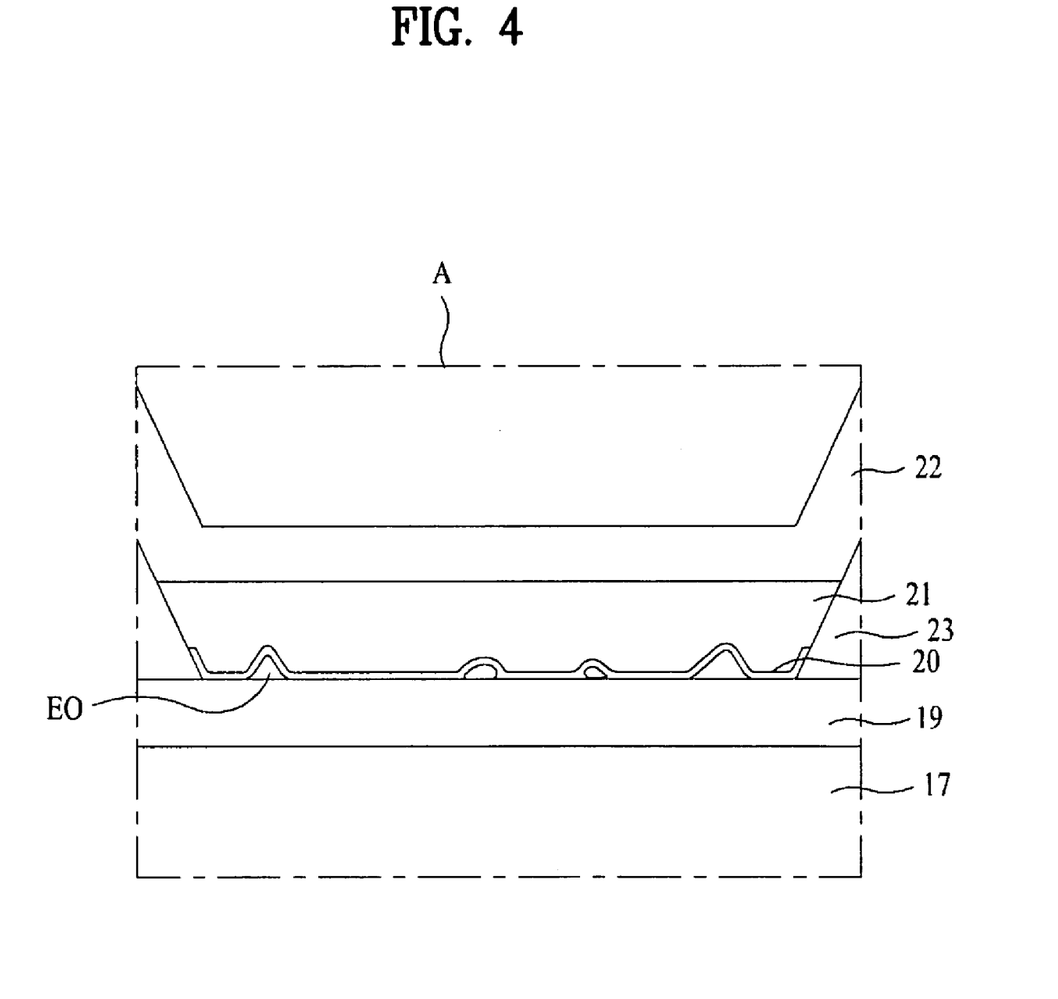
FIG. 4 shows an exemplary cross-section of an enlarged view of part A from FIG. 3B.

FIGS. 3A and 3B illustrate fabrication steps in a method for fabricating a lower substrate of the light emitting display device shown in FIG. 2, respectively. FIG. 4 shows an exemplary cross-section of an enlarged view of part A from FIG. 3B. A method for fabricating a lower substrate will be described with reference to FIGS. 3A, 3B, and 4. Referring to FIG. 3A, a gate metal material is deposited on a glass substrate which is used for a lower substrate 10, patterned, to form a gate electrode 11. Then, a gate insulating film 12 is deposited on an entire surface of the lower substrate 10 including the gate electrode 11, and a semiconductor layer forming material, an ohmic contact layer forming material, and a source/drain forming material are deposited on the gate insulating film 12 in succession.

Then, the semiconductor layer forming material, the ohmic contact layer forming material, and the source/drain forming material are patterned at the same time or in succession to form a switching device having a semiconductor layer 12, an ohmic contact layer 14, and the source/drain electrodes 15 and 16. Then, a protective film 17 is formed on an entire surface of the lower substrate 10 including the switching device and the gate insulating film 12, and patterned, to form a contact hole 18 to expose a predetermined region of the drain electrode 16 of the switching device.

ITO, IZO, AZO, or a material equivalent thereto is deposited on the lower substrate 10 by PECVD (Plasma Enhanced Chemical Vapor Deposition) or sputtering, and patterned, to form a first electrode 19. The first electrode 19 is in contact with the drain electrode 16 of the switching device, electrically.

Next, referring to FIG. 3B, an insulating material, such as oxide silicon SiOx, nitride silicon SiNx, photo acryl, benzo-cyclobutene BCB is deposited on an entire surface of the lower substrate 10 having the first electrode 19 formed thereon by PECVD, spin coating, or spinless coating, and patterned, to form a pixel defining layer 23 over the non-light emitting region having the switching device formed therein.

Then, at least one of conductive metals selected from aluminum Al, an aluminum alloy AlNd, copper Cu, silver Ag, titanium Ti, and chromium Cr is deposited to a thickness of 1~200 Å by PECVD, spin coating, spinless coating, or sputtering again, and patterned, to form a conductive metal thin film on the first electrode 19 except the pixel defining layer 23, and the conductive metal thin film is naturally oxidized, to form a oxide thin film 20.

Then, an organic light emitting layer 21 is formed on an entire surface of the first electrode 19 of the light emitting region having the oxide thin film 20 formed thereon by printing, a shadow mask method, or the laser induced thermal imaging. That is, though not shown in detail, the organic light emitting layer 21 is formed by depositing a hole injection layer HIL, a hole transporting layer HTL, a light emitting layer OEL, an electron injection layer EIL, and an electron transporting layer ETL in succession by the shadow mask method, the laser induced thermal imaging, or so on in succession. Particularly, in a case of formation of the light emitting layer OEL, the laser inducing thermal imaging enables micro-patterning of the light emitting layer, is applicable to a large area, and favorable for high resolution, and a dry type opposite to a wet type of the inkjet printing.

Then, a second electrode 22 is formed on an entire surface of the lower substrate 10 having the organic light emitting layer 21 formed thereon by PECVD or sputtering, which has a stack of at least one of metals selected from aluminum Al, an aluminum alloy AlNd, copper Cu, and a copper alloy which have a comparatively low work function and silver/calcium Ag/Ca. The second electrode 22 is formed to cover an entire surface of the organic light emitting layer 21 including the pixel defining layer 23.

Figure 5:
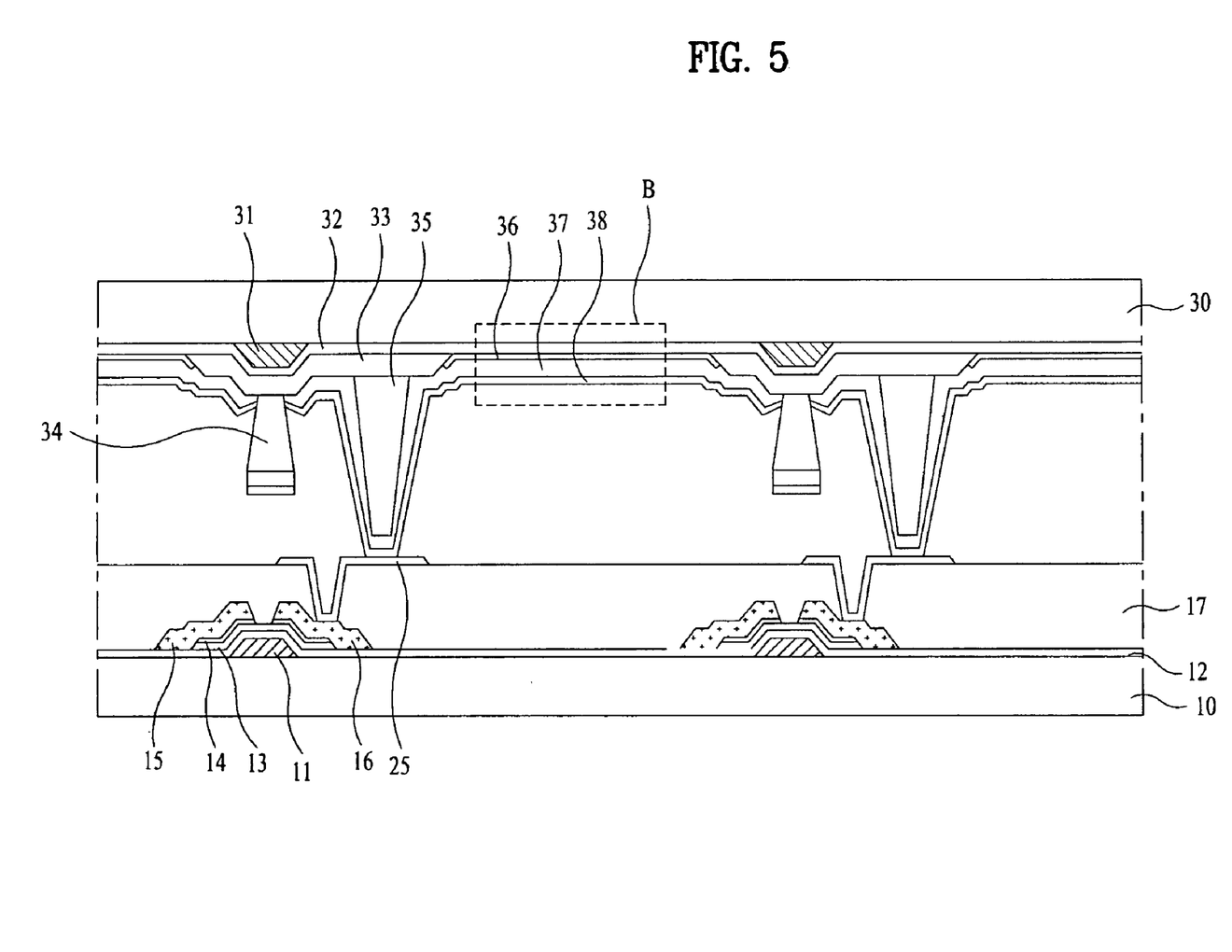
FIG. 5 illustrates a cross-section of a sub-pixel in a light emitting display device in accordance with another embodiment of the present invention.
Figure 6:
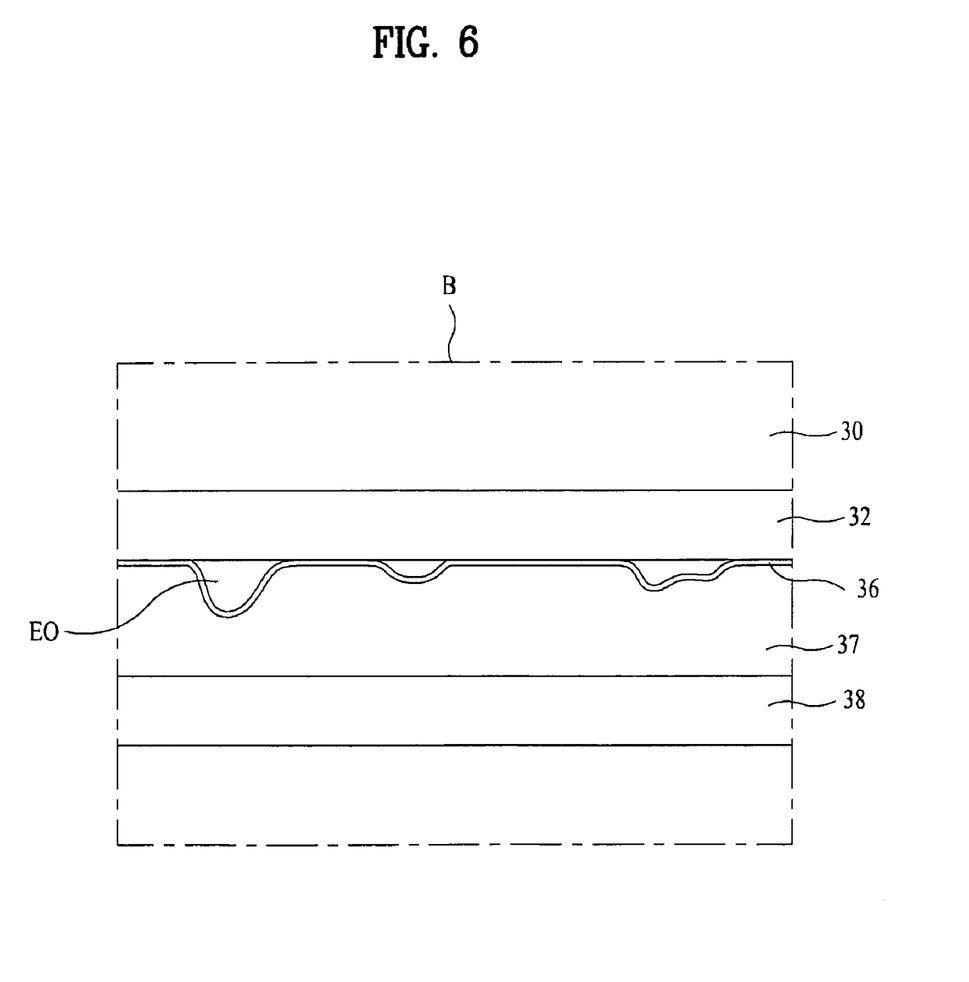
FIG. 6 illustrates shows an exemplary cross-section of an enlarged view of part B from FIG. 5.

FIG. 5 illustrates a cross-section of a sub-pixel in a light emitting display device in accordance with another embodiment of the present invention. FIG. 6 illustrates shows an exemplary cross-section of an enlarged view of part B from FIG. 5. Referring to FIG. 5, the light emitting display device includes a light emitting display panel having a lower substrate and an upper substrate 10 and 30 bonded together to face each other.

The lower and upper substrates 10 and 30 have a plurality of light emitting regions for displaying an image, and a plurality of non-light emitting regions for displaying no image. The non-light emitting region has the cell driver DRV for providing various signals required for driving the light emitting cell OEL at the light emitting regions. The lower and upper substrates 10 are bonded together with sealant applied to peripheries of the lower and upper substrates 10 and 30.

The lower substrate 10 in accordance with another embodiment of the invention is identical to the lower substrate 10 in FIG. 3A except the first electrode 19 and the contact electrode 25. Accordingly, refer to the description with reference to FIGS. 2 and 3A for description of configuration and fabrication method of the lower substrate 10, except that, instead of the first electrode 19 in FIG. 2, a contact electrode 25 having an identical shape is formed on the lower substrate 10 in FIG. 5.

A structure of the upper substrate 30 having a light emitting cell OEL formed thereon will be described in detail with reference to FIGS. 5 and 6.

Formed on the upper substrate 30, there are a supplementary electrode 31 formed at the non-light emitting region, a first electrode 31 formed on an entire surface of an under side of the upper substrate 30 including the supplementary electrode 31, a buffer layer 33 formed of an inorganic insulating material at the non-light emitting region of the upper substrate 30 having the first electrode 31 formed thereon, a contact spacer 35 formed on the non-light emitting region of the upper substrate 30 over the contact electrode 25 on the lower substrate 10, a separator 34 formed under the supplementary electrode 31 for dividing the light emitting regions into units of sub-pixels, an oxide thin film 36 formed on a surface of the first electrode 31 at the light emitting region for preventing defects caused by particle, an organic light emitting layer 37 formed on an entire surface of an underside of the upper substrate 30 to cover the oxide thin film 20, the separator 34, and the contact spacer 35, and a second electrode 38 formed on an entire surface of an underside of the organic light emitting layer 37.

The supplementary electrode 31 is formed of a low resistance metal for compensate for a resistance component of the first electrode 31 for applying a voltage more effectively. The supplementary electrode 31 is formed at the non-light emitting region of the upper substrate 30, the low resistance metal of the supplementary electrode 31 may be at least one of metals selected from aluminum Al, an aluminum alloy AlNd, copper Cu, silver Ag, and a copper alloy.

The first electrode 32 is formed on an entire surface of an underside of the upper substrate 30 to cover the supplementary electrode 31, fully. The first electrode may serve as an anode, and be formed of at least one of transparent conductive materials selected from ITO, IZO, and AZO. Because the first electrode 32 has one side connected to a common power line through a pad electrode (not shown) at the non-light emitting region, the first electrode 32 and the supplementary electrode 31 have a common power supplied thereto from the common power line.

The buffer layer 33 is formed of an inorganic material at the non-light emitting region having the supplementary electrode 31 formed thereon. The buffer layer 33 may be formed of one of inorganic insulating materials selected from SiNx, SiOx, SiON, SiOy for supplementing a thickness, a height, and an adhesive force of the contact spacer 35 or the separator 34.

The contact spacer 35 is formed in a columnar shape at a region where electric contact between the second electrode 38 on the upper substrate 30 and the lower substrate 10 is required. The contact spacer 35 may have a shape of an inverted taper, i.e., an inverted trapezoid. In detail, the contact spacer 35 is formed in a shape of the inverted trapezoid at a position partly over the contact electrode 25 of the lower substrate 10 such that the second electrode 38 formed on a lowest surface of the upper substrate 30 is in contact with the contact electrode 25 on the lower substrate 10. The contact spacer 35 may be formed of at least one of transparent organic materials having a refractive index of a visible light band selected from poly styrene, poly 2-vinylthiophene, and poly vinylcarbazole by patterning.

The separator 34 is formed under the supplementary electrode 31 in a shape of barrier surrounding each of the sub-pixels, and may be formed over a gate line GL or a data line DL on the lower substrate 10 depending on a position of the supplementary electrode 31. The separator 34 may be formed of a photosensitive organic material, such as photo resist PR, photo acryl, and benzocyclobutene BCB by coating and patterning.

The oxide thin film 36 is formed on an entire surface of an underside of the first electrode 32 to cover particle EO present on the first electrode 19, fully. As described, the oxide thin film 36 is formed to prevent defects caused by the particle EO present on the surface of the first electrode 19, and serves to make an electric contact area with the organic light emitting layer 37 to be formed layer greater, and to enhance an adhesive force to the organic light emitting layer 37. The oxide thin film 20 is formed of at least one of conductive metals selected from aluminum Al, an aluminum alloy AlNd, copper Cu, silver Ag, titanium Ti, and chromium Cr. In this instance, for preventing a light transmissivity from being impaired to the maximum, the oxide thin film 20 is formed to have a thickness of 1 Å~200 Å.

The organic light emitting layer 37 includes a hole injection layer HIL, a hole transporting layer HTL, a light emitting layer OEL, an electron injection layer EIL, and an electron transporting layer ETL. The hole injection layer HIL is formed on an entire surface of an underside of the upper substrate 30 including, for an example, the anode and the contact spacer 35, and the hole transporting layer HTL is formed on an entire surface of an underside of the upper substrate 30 including the hole injection layer HIL. The light emitting layer OEL is formed on the hole transporting layer HTL at the light emitting region, and the electron injection layer EIL is formed on an entire surface of an underside of the upper substrate 30 including the light emitting layer OEL and the hole transporting layer HTL. The electron transporting layer ETL is formed on an entire surface of the upper substrate 30 including the electron injection layer EIL.

The light emitting layer OEL includes a red light emitting layer for displaying a pixel of red color, a green light emitting layer for displaying a pixel of green color, and a blue light emitting layer for displaying a pixel of blue color. The light emitting layer OEL at each of the light emitting regions is one of the red light emitting layer, the green light emitting layer, and the blue light emitting layer. That is, the red light emitting layer, the green light emitting layer, and the blue light emitting layer form one unit pixel. In the meantime, the unit pixel may further include a white light emitting layer, when the unit pixel includes the red light emitting layer, the green light emitting layer, the blue light emitting layer, and the white light emitting layer.

The second electrode 38 is formed to cover the organic light emitting layer 37 separated in unit of a sub-pixel by the separator 34. The second electrode 38 may serve as a cathode or an anode, and may be formed of at least one of materials selected from aluminum Al, an aluminum alloy AlNd, copper Cu, a copper alloy, ITO, ITO/Ag/ITO, ITO/Ag/IZO (Indium Zinc Oxide), which have a low work function value, or a material equivalent thereto. The silver Ag reflects a light from the organic light emitting layer 37 upward in an upper side light emitting method.

As has been described, the light emitting display device and the method for fabricating the same can prevent defects from being caused by particle present on the first electrode 19 or 32 by forming a naturally oxidized metal thin film 20 or 36 on a surface of the first electrode 19 or 32. In an embodiment of the invention, the light emitting display device can make an electric contact area between the organic light emitting layer 21 or 37 and the first electrode 19 or 37 greater, can enhance an adhesive force to the organic light emitting layer to improve a process yield, can improve display efficiency of an image and reduce dark spots to improve reliability of the product.

It will be apparent to those skilled in the art that various modifications and variations can be made in the embodiments of the invention without departing from the spirit or scope of the inventions. Thus, it is intended that the present invention covers the modifications and variations of this invention provided they come within the scope of the appended claims and their equivalents.

What is claimed is:

1. A light emitting display device, comprising:
a first electrode formed at a light emitting region of a first substrate;
a transparent oxide thin film of about 1 Å to about 200 Å in thickness formed on an entire surface of the first electrode at the light emitting region to substantially cover particle on the entire surface of the first electrode;
an organic light emitting layer formed on an entire surface of the oxide thin film to emit a light; and
a second electrode formed on an entire surface of the first substrate including the organic light emitting layer,
a supplementary electrode formed at a non-light emitting region of the first substrate;
a buffer layer formed of an inorganic insulating material at the non-light emitting region of the first substrate including the supplementary electrode;
a contact spacer formed on the non-light emitting region of the first substrate over a contact electrode on a second substrate;
a separator formed under the supplementary electrode for dividing the light emitting regions into sub-pixel units,
wherein the first electrode is electrically connected to the supplementary electrode, the organic light emitting layer and the second electrode are separated into the sub-pixel units by the separator, and the second electrode is electrical) connected to a drain electrode of the switching device on the second substrate with the contact spacer.

2. The device as claimed in claim 1, wherein the transparent oxide thin film is formed of at least one of conductive metals selected from aluminum Al, an aluminum alloy AlNd, copper Cu, silver Ag, titanium Ti, and patterned and naturally oxidized chromium Cr.

3. The device as claimed in claim 1, further comprising at least one switching device including a gate electrode, source/drain electrodes, a semiconductor layer, an ohmic contact layer, a gate insulating film, and a protective film, and the first or second electrode is electrically connected to a drain electrode of the switching device.

4. A method for fabricating a light emitting display device, comprising:
forming a first electrode at a light emitting region of a first substrate;
forming a transparent oxide thin film of about 1 Å to about 200 Å in thickness on an entire surface of the first electrode at the light emitting region to substantially cover particle on the entire surface of the first electrode;
forming an organic light emitting layer on an entire surface of the oxide thin film to emit a light; and
forming a second electrode on an entire surface of the first substrate including the organic light emitting layer,
forming a supplementary electrode at a non-light emitting region of the first substrate;
forming a buffer layer of an inorganic insulating material at the non-light emitting region of the first substrate including the supplementary electrode;
forming a contact spacer on the non-light emitting region of the first substrate opposite to a contact electrode on a second substrate;
forming a separator opposite to the supplementary electrode for dividing the light emitting regions into sub-pixel units,
wherein the first electrode is electrically connected to the supplementary electrode, the organic light emitting layer and the second electrode are separated into the sub-pixel units by the separator, and the second electrode is electrically connected to a drain electrode of the switching device on the second substrate with the contact spacer.

5. The method as claimed in claim 4, wherein the transparent oxide thin film is formed of at least one of conductive metals selected from aluminum, an aluminum alloy, copper, silver, titanium and chromium.

6. The method as claimed in claim 5, wherein the forming of the transparent oxide thin film includes:
depositing the at least one of the conductive metals selected from aluminum, an aluminum alloy, copper, silver, titanium and chromium on the entire surface of the first electrode at the light emitting region by one of PECVD method, spin coating method, spinless coating method, or sputtering method to form the transparent oxide thin film,
patterning the at least one deposited conductive metal on the entire surface of the first electrode at the light emitting region, and
naturally oxidizing the at least one patterned conductive metal.

7. The method as claimed in claim 4, further comprising forming at least one switching device including a gate electrode, source/drain electrodes, a semiconductor layer, an ohmic contact layer, a gate insulating film, and a protective film, and
the first or second electrode is electrically connected to a drain electrode of the switching device.

* * * * *